(12) United States Patent
Shin et al.

(10) Patent No.: US 7,536,671 B2
(45) Date of Patent: May 19, 2009

(54) MASK FOR FORMING FINE PATTERN AND METHOD OF FORMING THE SAME

(75) Inventors: Jae-pil Shin, Suwon-si (KR); Young-Ile Kim, Yongin-si (KR); Moon-hyun Yoo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 220 days.

(21) Appl. No.: 11/590,352

(22) Filed: Oct. 31, 2006

(65) Prior Publication Data

US 2008/0082953 A1    Apr. 3, 2008

(30) Foreign Application Priority Data

Oct. 2, 2006    (KR) ...................... 10-2006-0097408

(51) Int. Cl.
*G06F 17/50* (2006.01)
*G06F 19/00* (2006.01)
*G03F 1/00* (2006.01)
*G21K 5/00* (2006.01)

(52) U.S. Cl. .................. 716/21; 700/119; 700/121; 430/5; 378/35

(58) Field of Classification Search .................. 716/21; 700/19, 21, 119, 121; 430/5; 378/35
See application file for complete search history.

(56) References Cited

U.S. PATENT DOCUMENTS

| | | | |
|---|---|---|---|
| 6,475,891 B2 | 11/2002 | Moon | 438/584 |
| 6,503,667 B1* | 1/2003 | Kobayashi | 430/5 |
| 6,553,274 B1* | 4/2003 | Motoyama et al. | 700/121 |
| 6,603,688 B2 | 8/2003 | Hasegawa et al. | 365/200 |
| 6,716,761 B2 | 4/2004 | Mitsuiki | 438/706 |
| 6,901,577 B2* | 5/2005 | Kotani et al. | 716/21 |
| 6,971,078 B2* | 11/2005 | Ohba et al. | 716/5 |
| 7,174,520 B2* | 2/2007 | White et al. | 716/4 |
| 7,387,854 B2* | 6/2008 | Kim | 430/5 |
| 7,435,512 B2* | 10/2008 | Chang | 430/5 |
| 7,469,396 B2* | 12/2008 | Hayashi et al. | 716/8 |
| 2002/0087942 A1* | 7/2002 | Kitada | 716/11 |
| 2003/0106037 A1* | 6/2003 | Moniwa et al. | 716/19 |
| 2003/0222260 A1* | 12/2003 | Tone et al. | 257/48 |
| 2004/0003359 A1* | 1/2004 | Ohba et al. | 716/5 |
| 2004/0221254 A1* | 11/2004 | Cobb | 716/19 |
| 2004/0229472 A1* | 11/2004 | Kobayashi | 438/736 |
| 2005/0044522 A1* | 2/2005 | Maeda | 716/18 |
| 2005/0064302 A1* | 3/2005 | Kotani et al. | 430/5 |

(Continued)

FOREIGN PATENT DOCUMENTS

KR    10-2002-0043862    6/2002

(Continued)

*Primary Examiner*—Phallaka Kik
(74) *Attorney, Agent, or Firm*—Mills & Onello, LLP

(57) ABSTRACT

In a mask for forming a fine pattern to completely transfer a first and a second pattern from the mask onto a receiving object, and a method of forming the mask, the mask includes a first pattern, a second pattern, and a supplemental pattern. The first pattern repeats in a first direction. The second pattern is arranged between and parallel to the first pattern and has a first width W1. The supplemental pattern is disposed between the first pattern and the second pattern, and is spaced apart by a first distance D1 in the first direction from the second pattern.

26 Claims, 8 Drawing Sheets

U.S. PATENT DOCUMENTS

| | | | |
|---|---|---|---|
| 2005/0076320 A1* | 4/2005 | Maeda | 716/10 |
| 2005/0132306 A1* | 6/2005 | Smith et al. | 716/1 |
| 2005/0136338 A1* | 6/2005 | Chang | 430/5 |
| 2005/0142501 A1* | 6/2005 | Kim | 430/394 |
| 2005/0193364 A1* | 9/2005 | Kotani et al. | 716/21 |
| 2006/0033900 A1* | 2/2006 | Saitoh et al. | 355/53 |
| 2006/0057471 A1* | 3/2006 | Schenau et al. | 430/5 |
| 2006/0081842 A1* | 4/2006 | Tone et al. | 257/48 |
| 2006/0180847 A1* | 8/2006 | Park et al. | 257/314 |
| 2006/0228636 A1* | 10/2006 | Mashita et al. | 430/5 |
| 2007/0166627 A1* | 7/2007 | Sugimoto | 430/5 |
| 2007/0226672 A1* | 9/2007 | Takita et al. | 716/11 |
| 2008/0216027 A1* | 9/2008 | White et al. | 716/4 |

FOREIGN PATENT DOCUMENTS

| | | |
|---|---|---|
| KR | 10-2002-0061480 | 7/2002 |

* cited by examiner

MASK FOR FORMING FINE PATTERN AND METHOD OF FORMING THE SAME

CROSS-REFERENCE TO RELATED PATENT APPLICATION

This application claims priority to Korean Patent Application No. 10-2006-0097408, filed on Oct. 2, 2006, in the Korean Intellectual Property Office, the disclosure of which is incorporated herein in its entirety by reference.

BACKGROUND OF THE INVENTION

1. Field of the Invention

The present invention relates to a mask for manufacturing a semiconductor device and a method of forming the mask, and more particularly, to a mask for forming a semiconductor device with a fine pattern and a method of forming the mask.

2. Description of the Related Art

With the continuous trend toward higher integration, patterns for forming semiconductor devices continue to gradually become finer. As the sizes of individual devices formed with fine patterns also continue to be reduced, the pitch (that is the width of a pattern and the spacing or interval between patterns) of a desired pattern must also be reduced. However, further reduction of the design rule to form line patterns is generally limited due to a resolution limit of the photolithography process that is used to form the patterns (for example, a line and space pattern—hereinafter referred to as a line pattern) when manufacturing a semiconductor device.

To overcome the resolution limitations of the photolithography process, double patterning methods have been proposed. Double patterning can be implemented in a variety of ways, such as a method of forming spacers of a small size (disclosed in U.S. Pat. No. 6,603,688, which is hereby incorporated by reference) and a self-aligning method (disclosed in Korean Patent Application No. 10-2005-0032297, which is hereby incorporated by reference).

In the double patterning methods, a first pattern is formed in a first direction using a photolithography process, and a second pattern is formed at a predetermined distance from the first pattern, using a method other than a photolithography process, for example, using spacers or a self-aligning method. However, in this approach, the patterns on a mask, especially the second pattern, are actually transferred to an object.

FIGS. 1A and 1B are sectional views for illustrating a fine pattern forming method using a self-aligning method, which is a conventional example of double patterning. Here, regions a and b are regions where the second pattern is prone to defects, and region c is a region where the second pattern is formed normally. Here, the defects refer to regions where the second pattern is not actually transferred to the object properly.

Referring to FIGS. 1A and 1B, a first mask pattern 14 formed using a photolithography process is repeatedly formed on a semiconductor substrate 10 with an etch layer 12 formed thereon. Here, the first mask pattern 14 is used for forming the first mask pattern 12a of the etch layer 12, as shown in FIG. 1B. A first mask layer 18 and a second mask layer 20 are subsequently formed on the semiconductor substrate 10 including the first mask pattern 14. The first mask layer 18 is formed to conformally cover the top and side surfaces of the first mask pattern 14 evenly, and preferably to a thickness that corresponds to a first distance D1 in region c. The second mask layer 20 conformally covers the first mask layer 18 to an even thickness. Here, the second mask layer 20 may be formed of a material having the same etching characteristics as that of the first mask pattern 14.

Next, wet etching is used to remove a portion of the second mask layer 20. As a result, a second mask pattern 20a remains on a recessed portion of the normal region that is region c. Here, the second mask pattern 20a is a mask that is used for forming the second pattern of the double patterning procedure. However, in this example, the second mask pattern 20a is not formed on the defective regions a and b since the second mask layer 20 is entirely removed by the wet etch in the defective regions a and b.

When anisotropic etching is performed after the second mask pattern 20a is formed, a first pattern 12a is formed at the bottom of the first mask pattern 14, and a second pattern 16c is properly formed below the second mask pattern 20a of the normal region c. However, the second mask pattern 20a is not properly formed on the defective regions a and b, and the second patterns 16a and 16b on the mask are therefore not properly transferred onto the semiconductor substrate 10.

SUMMARY OF THE INVENTION

Embodiments of the present invention provide a mask for forming a fine pattern, which properly transfers a first and a second pattern of the mask to an underlying object in a double patterning process.

Embodiments of the present invention also provide a method of forming the mask for forming a fine pattern, which properly transfers a first and a second pattern of the mask to an underlying object in a double patterning process.

According to one aspect of the present invention, there is provided a mask for forming a fine pattern, comprising: a first pattern repeating in a first direction; a second pattern arranged between and parallel to the first pattern and having a first width W1; and a supplemental pattern disposed between the first pattern and the second pattern, and spaced apart by a first distance D1 in the first direction from the second pattern.

The second distance D2 between the supplemental pattern in the first direction can be (W1+2×D1). The supplemental pattern can be a first supplemental pattern isolated from and spaced apart by the first distance from the second pattern. The first supplemental pattern can be disposed at the first distance D1 from a portion of the second pattern on remaining regions of the second pattern.

A second width W2 of the first supplemental pattern can be the same as the first width W1 of the second pattern. The first supplemental pattern can form a semi-rectangular shape that partially encompasses the second pattern. A second width W2 of the first supplemental pattern can be the same as the first width W1 of the second pattern.

The supplemental pattern can be a second supplemental pattern adjacent the first pattern between the first pattern and the second pattern that is spaced apart from the second pattern by the first distance D1. A distance between the first pattern and the second pattern can be greater than the first distance D1 and less than (W1+2×D1). If a third distance D3 between the first pattern and the second pattern is greater than the first distance D1 and less than (D1+W1), then a width W3 of the second supplemental pattern is less than the first distance D1. If a third distance D3 between the first pattern and the second pattern is greater than (D1+W1) and less than (W1+2×D1), then a width W3 of the second supplemental pattern is greater than the first distance D1.

According to another aspect of the present invention, there is provided a method of forming a mask for forming a fine pattern, the method comprising: forming a first pattern repeatedly on a mask in a first direction; forming a second pattern arranged between and parallel to the first pattern and having a first width W1; and forming a supplemental pattern disposed between the first pattern and the second pattern, and spaced apart by a first distance D1 in the first direction from the second pattern.

A second distance D2 between the supplemental pattern in the first direction can be (W1+2×D1). The supplemental pattern can be a first supplemental pattern isolated from and spaced apart by the first distance D1 from the second pattern.

Forming the first supplementary pattern can comprise: forming a first material layer of a width equal to the first distance D1 on at least one side of the second pattern; forming a second material layer of a width equal to the first width W1 on at least one side of the first material layer; and removing the first material layer of the first distance D1 and removing the second pattern, to form a first supplemental pattern. A distance between the second pattern and the first pattern can be greater than or equal to a sum of a width W2 of the first supplemental pattern and twice the first distance D1 (W2+2×D1). The first supplemental pattern can be spaced apart from the second pattern by the first distance D1 along a perimeter of the second pattern. The first supplemental pattern can form a semi-rectangular shape that partially encompasses the second pattern. The method can further comprise forming the second pattern at an original position thereof after forming the first supplemental pattern.

A width W2 of the first supplemental pattern can be the same as the width W1 of the second pattern. A distance between the second pattern and the first pattern can be greater than or equal to a sum of the width W1 of the second pattern and twice the first distance D1 (W1+2×D1).

The supplemental pattern can optionally be a second supplemental pattern adjacent the first pattern between the first pattern and the second pattern that is spaced apart from the second pattern by the first distance D1.

Forming of the second supplemental pattern can comprise: providing a material layer between the first pattern and at least one side of the second pattern; removing the first pattern; and removing a portion of the material layer of a width that is equal to the distance D1 and removing the second pattern, to form a second supplemental pattern. A distance between the first pattern and the second pattern can be greater than the first distance D1 and is less than a sum of the first width W1 and twice the first distance D1 (W1+2×D1). The second supplemental pattern can be spaced apart from the second pattern by the first distance D1. If a third distance D3 between the first pattern and the second pattern is greater than the first distance D1 and less than (D1+W1), then a width W3 of the second supplemental pattern is less than the first distance D1. If a third distance D3 between the first pattern and the second pattern is greater than (D1+W1) and less than (W1+2×D1), then a width W3 of the second supplemental pattern is greater than the first distance D1. The method can further comprise forming the second pattern at an original position thereof after forming the second supplemental pattern.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS OF THE INVENTION

Figure 1A:
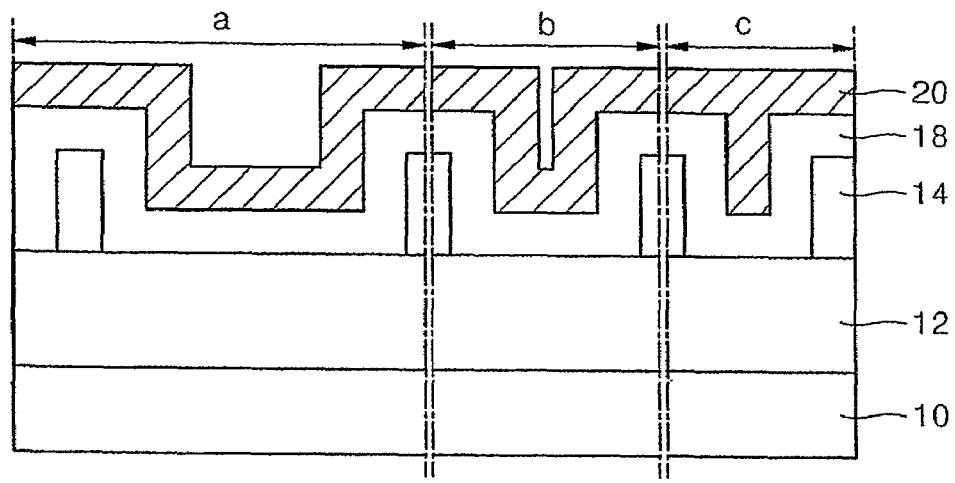
FIGS. 1A and 1B are sectional views that illustrate a fine pattern forming method using a self-aligning method, according to a conventional example of double patterning.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete. Like reference numerals in the drawings denote like elements, and thus their description will be omitted.

Embodiments of the present invention provide a mask for forming a fine pattern through double patterning, and a method of forming the mask. The fine pattern is divided into a first pattern formed through a photolithography process, and a second pattern arranged between the first pattern, in order to overcome limitations in the resolution of the photolithography process. When a fine pattern on a mask is transferred onto a receiving object, defective regions a and b and a normal region c, as illustrated in FIG. 1A, can occur. Embodiments of the present invention relate to a mask for preventing the occurrence of the defective regions a and b, and a method of forming such a mask.

Figure 1B:
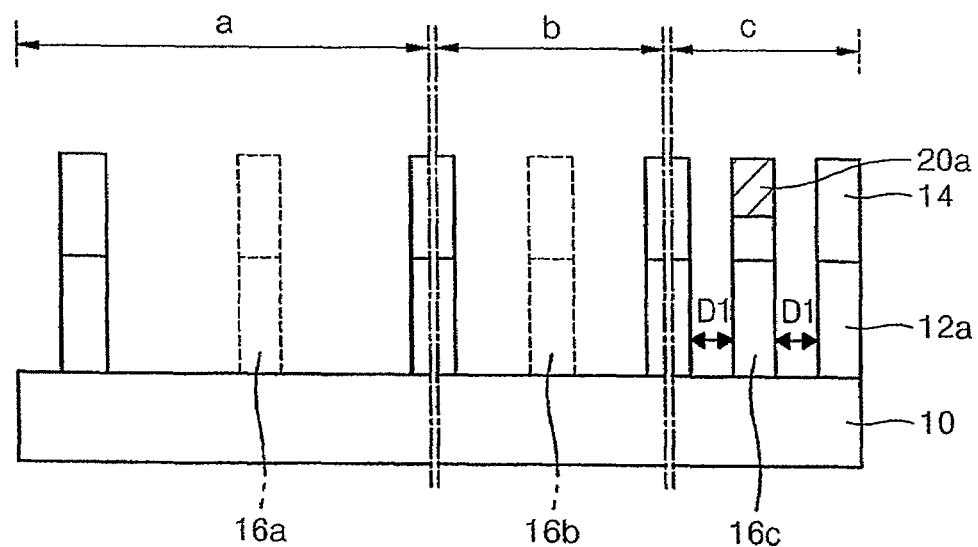
Figure 2:
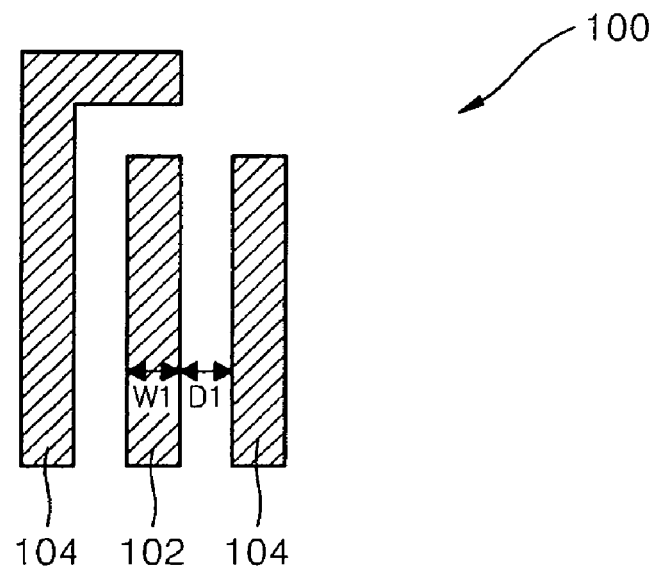
FIG. 2 is a plan view of a mask having a normal fine pattern.

Before describing the embodiments of the present invention, a description of the mask for region c of the above example of FIG. 1 will be given. FIG. 2 is a plan view of a mask 100 with a fine pattern corresponding to the normal region c of the above example.

Referring to FIG. 2, the fine pattern in the normal region c includes first patterns 104 that are formed repeatedly in a first direction and a second pattern 102 formed between the first patterns 104. The first patterns 104 are patterns that are formed on a receiving object by a photolithography process. The second pattern 102 has a first width W1, and is spaced apart a distance D1 and is set parallel to the first patterns 104. Therefore, in this example, the spacing distance between the first patterns 104 on either side of the second pattern 102 is (W1+2×D1).

A mask for forming a fine pattern in what is referred to above as the defective regions a and b of FIGS. 1A and 1B will now be described. The defective region a (hereinafter called the first defect) will be described in a first embodiment, and the defective region b (hereinafter called the second defect) will be described in a second embodiment.

First Embodiment

Figure 3:
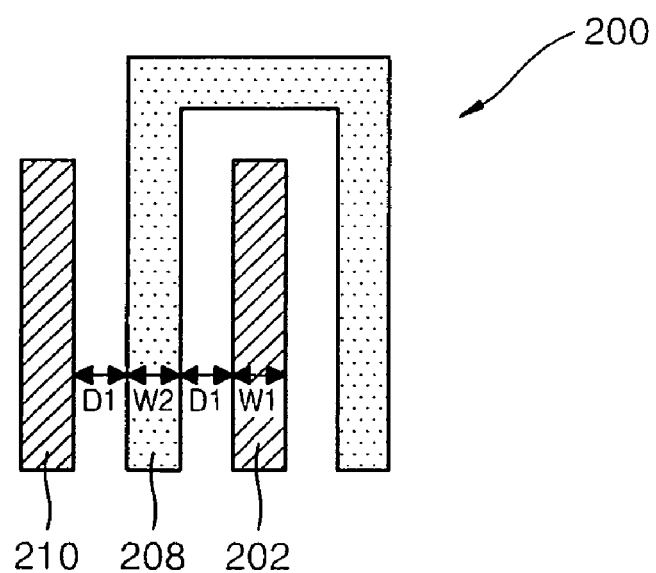
FIG. 3 is a plan view of a mask having a fine pattern formed in a region containing a first defect, according to a first embodiment of the present invention.

FIG. 3 is a plan view of a mask 200 with a fine pattern formed in a region containing a first defect, according to the first embodiment of the present invention.

Referring to FIG. 3, an object for pattern transfer, which resides on the mask, has a second pattern 202 with a first type of defect that has not been transferred. Assume, for example, that a first pattern 210 is not disposed at a distance of (W2+ 2×D1) from one side of the second pattern 202. Here, W2 is the width of a first supplemental pattern 208 to be described below. Specifically, the first type of defect, referred to herein as a "first defect", can appear when the distance between the first pattern 210 and the second pattern 202 is equal to or greater than the sum of the width W2 of the first supplemental pattern and the first distance D1×2, i.e., (W2+2×D1).

The width W1 of the second pattern 202 is the minimum width that can be formed using the photolithography process. Also, the width W1 of the second pattern can, in one embodiment, be the same as the width W2 of the first supplemental pattern 208. The first supplemental pattern 208 is spaced apart from the second pattern 202 by the first distance D1 and is independently disposed. The method of forming the first supplemental pattern 208 winnow be described in detail below.

Figure 4:
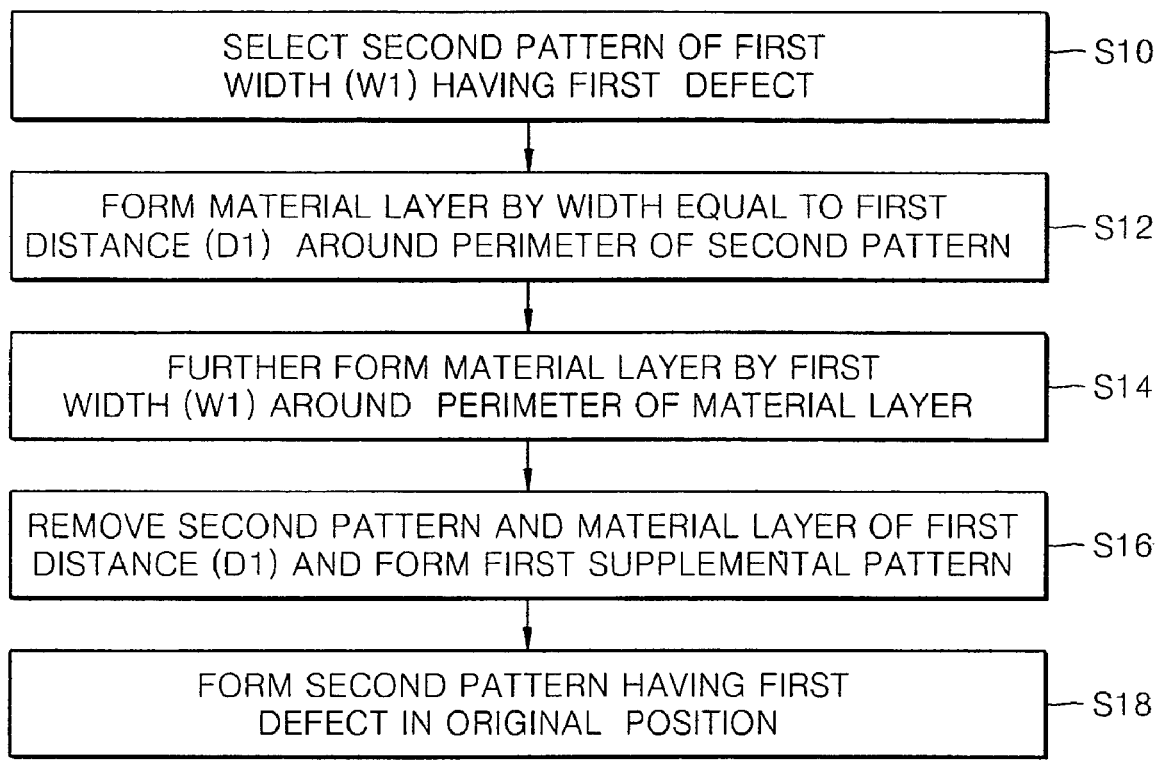
FIG. 4 is a flow diagram of a method for forming a first supplemental pattern according to the first embodiment of the present invention.

FIG. 4 is a flow diagram of a method for forming a first supplemental pattern 208 according to the first embodiment of the present invention, and FIGS. 5A through 5E are plan views for further describing the method of FIG. 4. First, formation of the linear second pattern 202 will now be described.

Figure 5A:
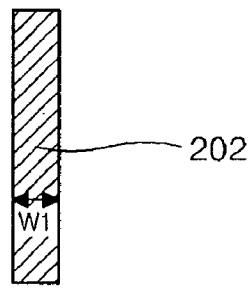
FIGS. 5A through 5E are plan views that further describe the method of FIG. 4.

Referring to FIGS. 4 and 5A, the second pattern 202 with the first width W1 having the first defect is selected from the mask in step S10. The first defect is, in this example, the same as that described above with reference to FIG. 3. When the first defect is present, the second pattern 202 on the mask is not properly transferred onto the receiving object. The second pattern 202 may be provided in a variety of forms. That is, when the second pattern 202 is an individual, isolated, entity, it may have the first pattern 104 (in FIG. 2) separated from a portion thereof by a first distance D1, and the remainder thereof may be protruded and form the first defect.

Figure 5B:
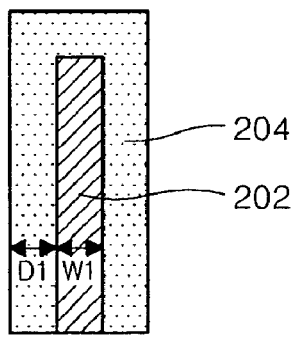

Referring to FIGS. 4 and 5B, a first material layer 204 with a width equal to the first distance D1 is formed on at least one side of the second pattern 202 in step S12. Also, the first material layer 204, as illustrated in FIG. 5B, may be formed with a width equal to the first distance D1 around the perimeter of the second pattern 202. The first material layer 204 may be formed of a conventional light blocking material such as chrome (Cr).

Figure 5C:
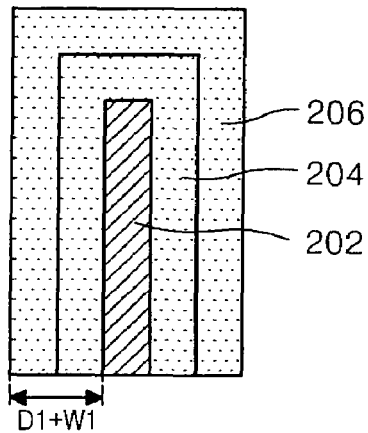

Referring to FIGS. 4 and 5C, a second material layer 206 with a predetermined width (a first width W1, for example) is further formed to at least one side of the first material layer 204 in step S14. The second material layer 206, as illustrated in FIG. 5C, may optionally be formed with a width equal to the first width W1 around the perimeter of the first material layer 204.

Figure 5D:
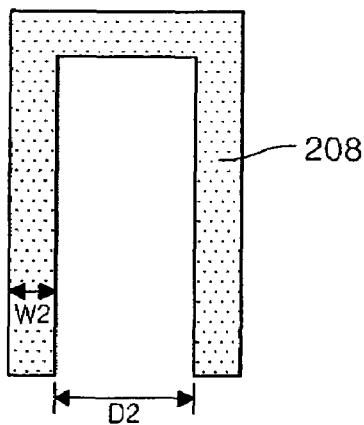

Referring to FIGS. 4 and 5D, the second pattern 202 and the first material layer 204 of a width of the first distance D1 are removed, and a first supplemental pattern 208 with a second width W2 is thereby formed in step S16. Accordingly, the remaining second material layer 206 may be the first supplemental pattern 208. That is, the width W2 of the first supplemental pattern may be equal to the width W1 of the second pattern. The first supplemental pattern 208 is spaced apart from the second pattern 202 having the first defect by the first distance D1, so that it is isolated. In other words, the first supplemental pattern 208 is not attached to any other pattern and is thereby isolated.

The distance D2 between the first supplemental pattern 208 may be (W1+2×D1). The first supplemental pattern 208 may be formed with one side open as shown to create an inner space within a semi-rectangular perimeter. Here, the width W2 of the resulting first supplemental pattern 208 may be the same as the first width W1.

Figure 5E:
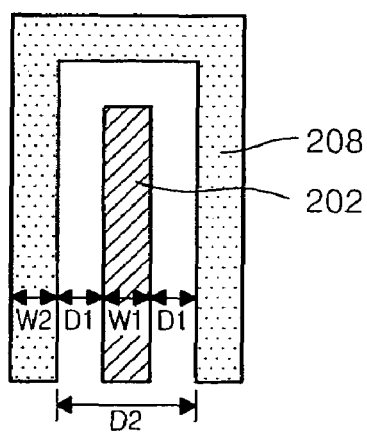

Referring to FIGS. 4 and 5E, after the first supplemental pattern 208 is formed, the removed second pattern 202 is restored to its original position in step S18. Thus, the first supplemental pattern 208 is spaced from the second pattern 202 by the first distance D1 to be separately disposed.

Second Embodiment

Figure 6:
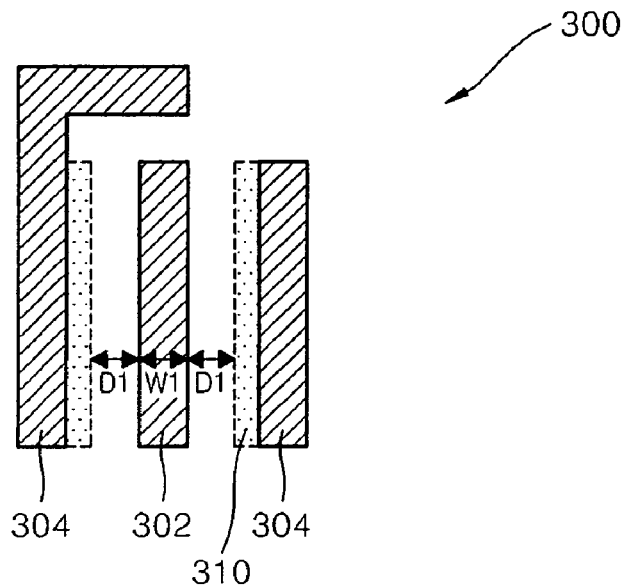
FIG. 6 is a plan view of a mask with a fine pattern formed in a region containing a second defect, according to a second embodiment of the present invention.

FIG. 6 is a plan view of a mask 300 with a fine pattern formed in a region containing a second defect, according to the second embodiment of the present invention.

Referring to FIG. 6, a first pattern 304 is disposed on at least one side of a second pattern 302 residing on a mask but which has not yet been transferred to a receiving object. Here, a second type of defect, referred to herein as a "second defect" can appear when the space between the first and second patterns 304 and 302 is greater than the first distance D1 and less than the sum of the first width W1 and the first distance D1×2 (W1+2×D1). To secure the first distance D1 between the second pattern 302, a second supplemental pattern 310 is attached to the first pattern 304 at a portion thereof between the first pattern 304 and the second pattern 302. The width W1 of the second pattern 302 may be a minimum width that can be formed through the photolithography process. The method of forming the second supplemental pattern 310 will be described in detail below.

Figure 7:
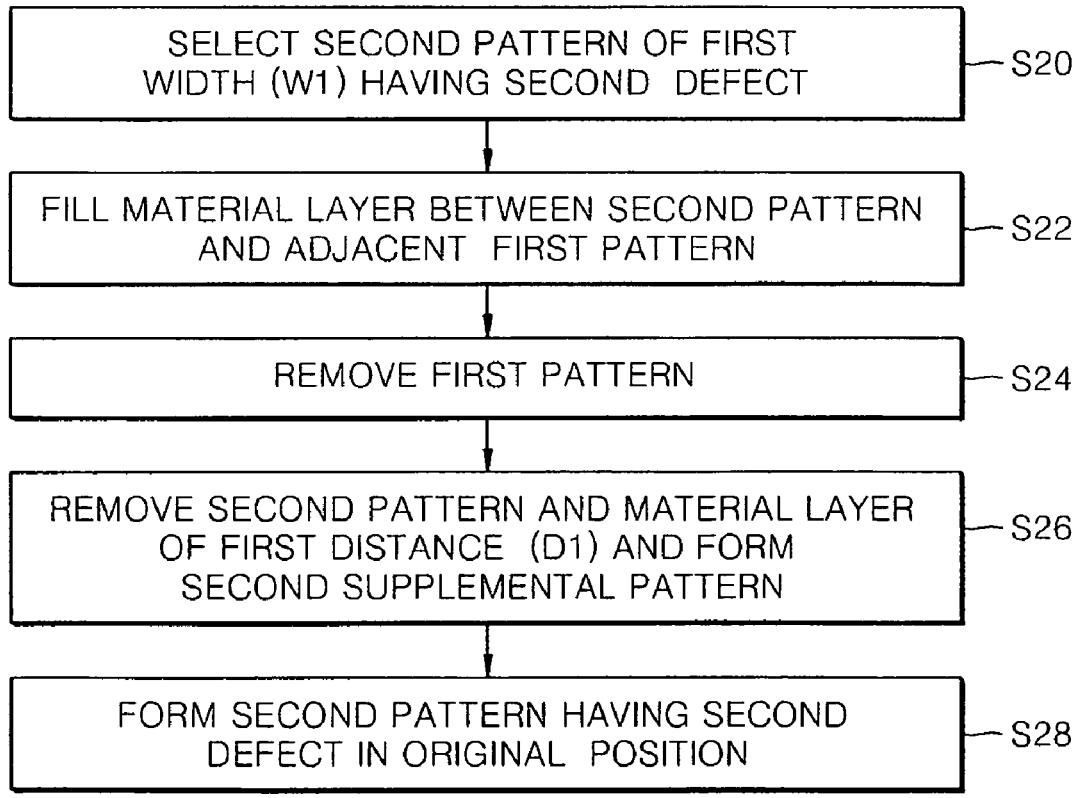
FIG. 7 is a flow diagram of a method for forming a second supplemental pattern according to the second embodiment of the present invention.

FIG. 7 is a flow diagram of a method for forming a second supplemental pattern (310) according to the second embodiment of the present invention, and FIGS. 8A through 8E are plan views for further describing the method of FIG. 7. Formation of the linear second pattern 302 will now be described.

Figure 8A:
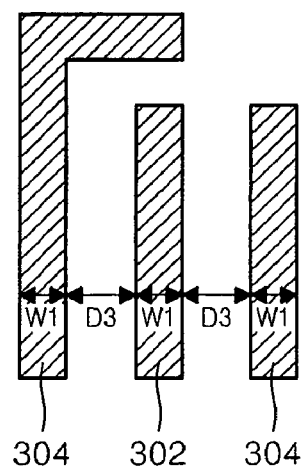
FIGS. 8A through 8E are plan views that further describe the method of FIG. 7.

Referring to FIGS. 7 and 8A, the second pattern 302 of the first width W1 having the second defect is selected from a mask in step S20. The second defect is the same as that described with reference to FIG. 6. When the second defect exists, the second pattern 302 on the mask is not transferred to the receiving object. The second pattern 302 may be provided in a variety of forms. That is, when the second pattern 302 is an individual entity, it may take the form of the first pattern 104 (in FIG. 2) separated from a portion thereof by a first distance D1, and the remainder thereof may form the second defect. Here, a distance D3 between the first pattern 304 and the second pattern 302 is greater than the first distance D1. Specifically, the third distance D3 is greater than the first distance D1 and smaller than (W1+2×D1).

Figure 8B:
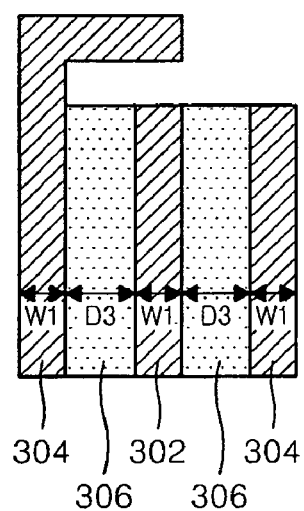

Referring to FIGS. 7 and 8B, the gap between at least one side of the second pattern 302 and the adjacent first pattern 304 is filled with a material layer 306 in step S22. Also, the material layer 306, as illustrated in FIG. 8B, may fill either side of the second pattern 302. The width of the material layer 306 may be the same as the distance D3 between the first pattern 304 and the second pattern 302.

Figure 8C:
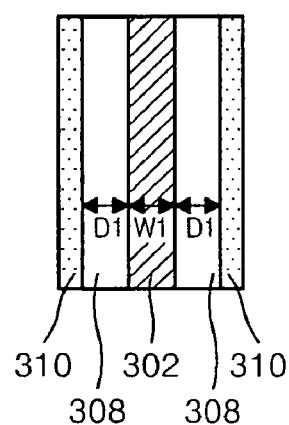

Referring to FIGS. 7 and 8C, the first pattern 304 is removed in step S24. Accordingly, the second pattern 302 and the material layer 306 remain on the mask. The width of the material layer 306 remaining on at least one side of the second pattern 302 includes a first portion 308 of a width that is the same as the first distance D1 and a second portion 310 of a width W3 that is a width of a second supplemental pattern 310 that is subsequently formed.

Figure 8D:
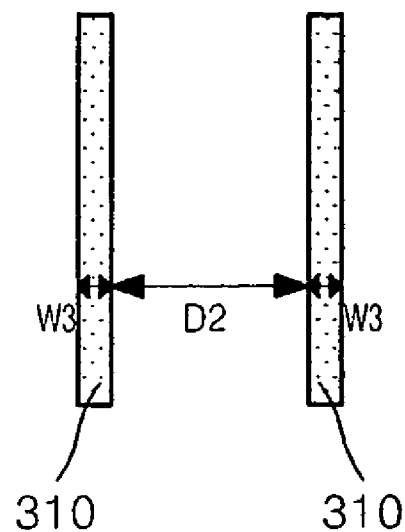

Referring to FIGS. 7 and 8D, the second pattern 302 and the first portion 310 of the material layer 306 of the width that is the same as the first distance D1 is removed, and the second supplemental pattern 310 of the third width W3 is formed in step S26. As a result, the second supplemental pattern 310 is spaced apart from the at least one side of the second pattern 302 by the first distance D1. The width W3 of the second supplemental pattern 310 may be determined by the distance D3 between the first pattern 304 and the second pattern 302. That is, if D1<D3<(D1+W1), then the width W3 is less than the first distance D1; and if (D1+W1)<D3<(W1+2×D1), then the width W3 is greater than the first distance D1. The distance D2 between the second supplemental patterns 310 may be (W1+2×D1).

Figure 8E:
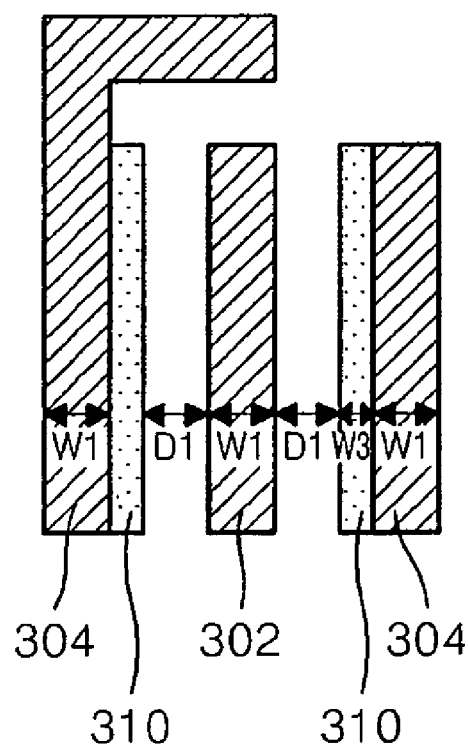

Referring to FIGS. 7 and 8E, after the second supplemental pattern 310 is formed, the second pattern 302 is reformed in its original position in step S28. Thus, the second supplemental patterns 310 are spaced the first distance D1 from the second pattern 302 and are attached to the first pattern 304.

Figure 9A:
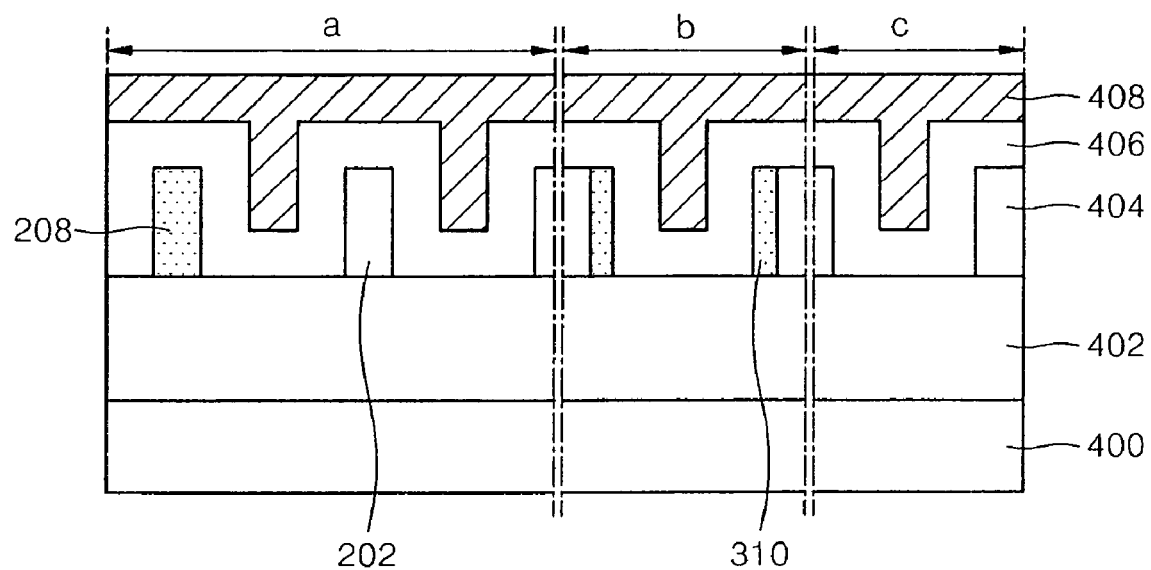
FIGS. 9A and 9B are sectional views illustrating a fine pattern forming process using an exemplary self-aligning method for double patterning, according to embodiments of the present invention.
Figure 9B:
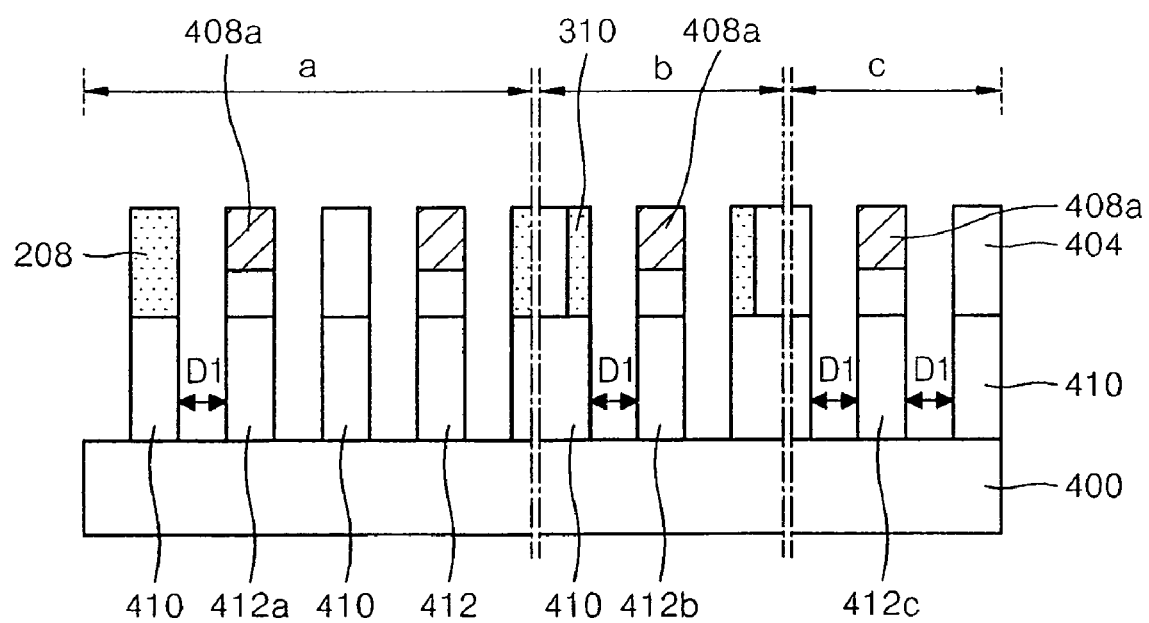

FIGS. 9A and 9B are sectional views illustrating a fine pattern forming process using an exemplary self-aligning method for double patterning, according to embodiments of the present invention. Here, regions a and b are respectively regions on which the first supplemental pattern 208 and the second supplemental pattern 310 are transferred, and region c is a region on which the normal second pattern is formed.

Referring to FIGS. 9A and 9B, a first mask pattern 404 is repeatedly formed through a photolithography process on a semiconductor substrate 400 with an etching layer 402 formed thereon. Here, the first mask pattern 404 is for forming the first pattern 410 (in FIG. 9B) of the double patterning procedure described above. A first mask layer 406 and a second mask layer 408 are formed on the semiconductor substrate 400 with the first mask pattern 404 formed thereon. The first mask layer 406 conformally covers the upper and side surfaces of the first mask pattern 404 with a uniform thickness of a first distance D1. The second mask layer 408 conformally covers the first mask layer 406 with a uniform thickness. Here, the second mask layer 408 may comprise a material having the same etching characteristics as the first mask pattern 404.

Next, wet etching is used to remove a portion of the second mask layer 408. A second mask pattern 408a remains in recessed regions of the second mask layer 408 in the normal region c. Here, the second mask pattern 408a is a mask that is used for forming a second pattern of the double patterning procedure, and a normal second pattern 412c is formed in the normal region c, as described with reference to FIG. 2.

Also, the first supplemental pattern 208 is disposed adjacent to the second pattern 412 spaced apart by a first distance D1 in the defective region a. Thus, the second mask pattern 408a is properly formed through wet etching in the recessed region of the second mask layer 408. The second supplemental pattern 310 is formed adjacent to the second pattern 412 with the first distance D1 therebetween on the defective region b. Thus, the second mask pattern 408a is properly formed through wet etching on the recessed region of the second mask layer 408.

With the second mask pattern 408a properly formed, when anisotropic etching is performed, a first pattern 410 is properly formed below the first mask pattern 404, and second patterns 412a, 412b, and 412c are properly formed below the second mask pattern 408a. Accordingly, a desired second pattern is formed on the entire regions of a semiconductor substrate 400 including the otherwise defective regions a and b.

In the mask for forming the fine patterns and the method of formation of the mask, according to the present invention described above, a supplemental pattern that can separate the first and second patterns by a first distance D1 is formed, so that the first and second patterns on the mask can be properly transferred to a underlying receiving object on the substrate in a double patterning process.

While the present invention has been particularly shown and described with reference to exemplary embodiments thereof, it will be understood by those of ordinary skill in the art that various changes in form and detail may be made herein without departing from the spirit and scope of the present invention as defined by the following claims.

What is claimed is:

1. A mask for forming a fine pattern, comprising:
   a first pattern repeating in a first direction;
   a second pattern arranged between and parallel to the first patterns repeated in the first direction and having a first width W1; and
   a supplemental pattern disposed between the first pattern and the second pattern, and spaced apart by a first distance D1 in the first direction from the second pattern,
   wherein a second distance D2 between portions of the supplemental pattern in the first direction is (W1+2×D1).

2. The mask of claim 1, wherein the supplemental pattern is a first supplemental pattern isolated from and spaced apart by the first distance from the second pattern.

3. The mask of claim 2, wherein the first supplemental pattern is disposed at the first distance D1 from a portion of the second pattern on remaining regions of the second pattern.

4. The mask of claim 2, wherein a second width W2 of the first supplemental pattern is the same as the first width W1 of the second pattern.

5. The mask of claim 2, wherein the first supplemental pattern forms a semi-rectangular shape that partially encompasses the second pattern.

6. The mask of claim 5, wherein a second width W2 of the first supplemental pattern is the same as the first width W1 of the second pattern.

7. The mask of claim 1, wherein the supplemental pattern is a second supplemental pattern adjacent the first pattern between the first pattern and the second pattern that is spaced apart from the second pattern by the first distance D1.

8. The mask of claim 7, wherein a distance between the first patterns and the second pattern is greater than the first distance D1 and less than (W1+2×D1).

9. The mask of claim 7, wherein if a third distance D3 between the first patterns and the second pattern is greater than the first distance D1 and less than (D1+W1), then a width W3 of the second supplemental pattern is less than the first distance D1.

10. The mask of claim 7, wherein if a third distance D3 between the first patterns and the second pattern is greater than (D1+W1) and less than (W1+2×D1), then a width W3 of the second supplemental pattern is greater than the first distance D1.

11. A method of forming a mask for forming a fine pattern, the method comprising:
   forming a first pattern repeatedly on a mask in a first direction;
   forming a second pattern arranged between and parallel to the first patterns repeated in the first direction and having a first width W1; and forming a supplemental pattern disposed between the first pattern and the second pattern, and spaced apart by a first distance D1 in the first direction from the second pattern, wherein a second distance D2 between portions of the supplemental pattern in the first direction is (W1+2×D1).

12. The method of claim 11, wherein the supplemental pattern is a first supplemental pattern isolated from and spaced apart by the first distance D1 from the second pattern.

13. The method of claim 12, wherein forming the first supplementary pattern comprises:

forming a first material layer of a width equal to the first distance D1 on at least one side of the second pattern;

forming a second material layer of a width equal to the first width W1 on at least one side of the first material layer; and removing the first material layer of the first distance D1 and removing the second pattern, to form a first supplemental pattern.

14. The method of claim 13, wherein a distance between the second pattern and the first patterns is greater than or equal to a sum of a width W2 of the first supplemental pattern and twice the first distance D1(W2+2×D1).

15. The method of claim 13, wherein the first supplemental pattern is spaced apart from the second pattern by the first distance D1 along a perimeter of the second pattern.

16. The method of claim 13, wherein the first supplemental pattern forms a semi-rectangular shape that partially encompasses the second pattern.

17. The method of claim 13, further comprising forming the second pattern at an original position thereof after forming the first supplemental pattern.

18. The method of claim 13, wherein a width W2 of the first supplemental pattern is the same as the width W1 of the second pattern.

19. The method of claim 18, wherein a distance between the second pattern and the first patterns is greater than or equal to a sum of the width W1 of the second pattern and twice the first distance D1 (W1+2×D1).

20. The method of claim 11, wherein the supplemental pattern is a second supplemental pattern adjacent the first patterns between the first patterns and the second pattern that is spaced apart from the second pattern by the first distance D1.

21. The method of claim 20, wherein the forming of the second supplemental pattern comprises:

providing a material layer between the first pattern and at least one side of the second pattern;

removing the first pattern; and removing a portion of the material layer of a width that is equal to the distance D1 and removing the second pattern, to form a second supplemental pattern.

22. The method of claim 21, wherein a distance between the first patterns and the second pattern is greater than the first distance D1 and is less than a sum of the first width W1 and twice the first distance D1 (W1+2×D1).

23. The method of claim 21, wherein if a third distance D3 between the first patterns and the second pattern is greater than the first distance D1 and less than (D1+W1), then a width W3 of the second supplemental pattern is less than the first distance D1.

24. The method of claim 21, wherein if a third distance D3 between the first patterns and the second pattern is greater than (D1+W1) and less than (W1+2×D1), then a width W3 of the second supplemental pattern is greater than the first distance D1.

25. The method of claim 20, wherein the second supplemental pattern is spaced apart from the second pattern by the first distance D1.

26. The method of claim 20, further comprising forming the second pattern at an original position thereof after forming the second supplemental pattern.

* * * * *